(12) United States Patent
Ikeda et al.

(10) Patent No.: US 12,338,532 B2
(45) Date of Patent: Jun. 24, 2025

(54) PLASMA PROCESSING METHOD AND PLASMA PROCESSING APPARATUS

(71) Applicant: TOKYO ELECTRON LIMITED, Tokyo (JP)

(72) Inventors: Taro Ikeda, Yamanashi (JP); Eiki Kamata, Yamanashi (JP); Yoshiyuki Kondo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 52 days.

(21) Appl. No.: 17/576,012

(22) Filed: Jan. 14, 2022

(65) Prior Publication Data

US 2022/0230848 A1    Jul. 21, 2022

(30) Foreign Application Priority Data

Jan. 19, 2021   (JP) .................................. 2021-006262

(51) Int. Cl.
   *C23C 16/511*   (2006.01)
   *H01J 37/32*    (2006.01)

(52) U.S. Cl.
   CPC ........ *C23C 16/511* (2013.01); *H01J 37/3222* (2013.01); *H01J 37/32302* (2013.01); *H01J 37/32311* (2013.01); *H01J 37/3244* (2013.01); *H01J 2237/332* (2013.01)

(58) Field of Classification Search
   None
   See application file for complete search history.

(56) References Cited

U.S. PATENT DOCUMENTS

| | | | | |
|---|---|---|---|---|
| 2001/0006849 A1* | 7/2001 | Suzuki | ............... | H01J 37/32302 438/712 |
| 2013/0062341 A1* | 3/2013 | Ashida | ............... | H01J 37/32192 219/715 |
| 2017/0040145 A1* | 2/2017 | Brandon | ........... | H01J 37/32293 |
| 2017/0330727 A1* | 11/2017 | Lee | ..................... | H01J 37/3244 |
| 2018/0294143 A1* | 10/2018 | Chua | ................... | H01J 37/3299 |

FOREIGN PATENT DOCUMENTS

JP         2005129323 A  *  5/2005
WO    WO 2008/013112 A1    1/2008

* cited by examiner

*Primary Examiner* — Jose I Hernandez-Kenney
(74) *Attorney, Agent, or Firm* — Fenwick & West LLP

(57) ABSTRACT

Embodiments of this application discloses a plasma processing method performed in a plasma processing apparatus having a plurality of plasma sources, the plasma processing method comprising: controlling each of the plasma sources so that at least one plasma source of the plurality of plasma sources is in a first state referring an OFF-state or a power state of a first level and the remaining plasma sources are in a second state referring an ON-state or a power state of a second level higher than the power state of the first level; and generating plasma from a processing gas with power output from the plurality of plasma sources, and processing a substrate, wherein said controlling of each of the plasma sources includes repeatedly controlling so that the plasma source of the first state among the plurality of plasma sources is sequentially transitioned.

8 Claims, 8 Drawing Sheets

II – II CROSS SECTION

PLASMA PROCESSING METHOD AND PLASMA PROCESSING APPARATUS

CROSS-REFERENCE TO RELATED APPLICATIONS

This application claims priority to Japanese Patent Application No. 2021-006262 filed on Jan. 19, 2021, the entire contents of which are incorporated herein by reference.

TECHNICAL FIELD

The present disclosure relates to a plasma processing method and a plasma processing apparatus.

BACKGROUND

For example, WO 2008/013112 A1 proposes a microwave plasma processing apparatus having a plurality of microwave plasma sources that output microwaves in a state of being distributed into a plurality of microwaves and introducing the plurality of distributed microwaves from the plurality of microwave plasma sources into a chamber.

SUMMARY

Surface waves of microwaves introduced into a chamber propagate and interfere with a bottom surface of a ceiling wall of the chamber, which may affect plasma processing such as film characteristics at the time of film formation.

The present disclosure provides a plasma processing method and a plasma processing apparatus capable of achieving in-plane uniformity of a plasma processing substrate.

In accordance with an aspect of the present disclosure, there is provided a plasma processing method performed in a plasma processing apparatus having a plurality of plasma sources. The plasma processing method comprises: controlling each of the plasma sources so that at least one plasma source of the plurality of plasma sources is in a first state referring an OFF-state or a power state of a first level and the remaining plasma sources are in a second state referring an ON-state or a power state of a second level higher than the power state of the first level; and generating plasma from a processing gas with power output from the plurality of plasma sources, and processing a substrate. Said controlling of each of the plasma sources includes repeatedly controlling so that the plasma source of the first state among the plurality of plasma sources is sequentially transitioned.

BRIEF DESCRIPTION OF THE DRAWINGS

FIG. 8 is a diagram illustrating Examples 2 and 4 of the plasma processing method according to the embodiment and an example of experimental results when all the plasma sources are turned on.

FIG. 9 is a diagram illustrating Examples 2 and 4 of the plasma processing method according to the embodiment and an example of experimental results when all the plasma sources are turned on.

DETAILED DESCRIPTION

Figure 1:
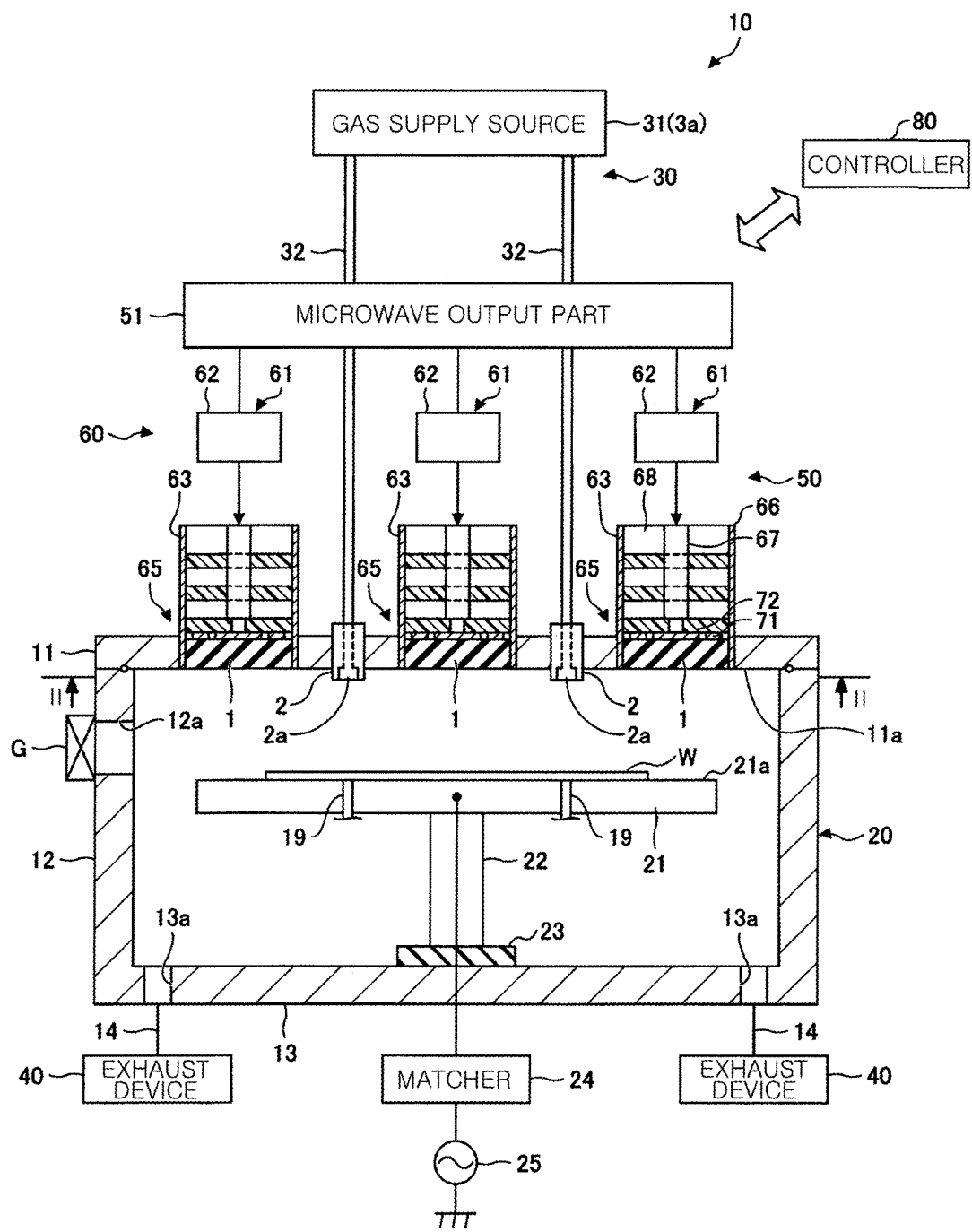
FIG. 1 is a schematic cross-sectional view illustrating an example of a plasma processing apparatus according to an embodiment.

Hereinafter, embodiments of the present disclosure will be described with reference to the accompanying drawings. In each drawing, the same components may be designated by the same reference numerals and redundant descriptions may be omitted.

[Plasma Processing Apparatus]

A plasma processing apparatus 10 according to an embodiment will be described with reference to FIG. 1. FIG. 1 is a schematic diagram illustrating an example of the plasma processing apparatus 10 according to the embodiment. The plasma processing apparatus 10 according to the embodiment is an example of a chemical vapor deposition (CVD) film forming apparatus and is a microwave plasma processing apparatus that generates plasma from a processing gas by microwaves and performs plasma processing on a substrate.

The plasma processing apparatus 10 includes a chamber 20, a mounting table 21, a gas supply mechanism 30, an exhaust device 40, a microwave introducing module 50, and a controller 80. The chamber 20 accommodates a substrate W, for example, a wafer. The mounting table 21 is disposed inside the chamber 20 and includes a mounting surface 21a on which the substrate W is mounted. The gas supply mechanism 30 supplies gas into the chamber 20. The exhaust device 40 exhausts and reduces the pressure of the inside of the chamber 20. The microwave introducing module 50 introduces microwaves for converting the processing gas supplied into the chamber 20 to plasma. The controller 80 controls each part of the plasma processing apparatus 10.

The chamber 20 has, for example, a cylindrical shape. For example, the chamber 20 is formed of metal materials such as aluminum and alloys thereof. The microwave introducing module 50 is disposed on an upper portion of the chamber 20 and serves as a plasma generator that introduces electromagnetic waves (microwaves in the embodiment) into the chamber 20 to generate plasma.

The chamber 20 includes a ceiling wall 11, a bottom wall 13, and a side wall 12 connecting the ceiling wall 11 and the bottom wall 13, which have a plate shape. The ceiling wall 11, which is a conductive member, has a plurality of openings disposed in the upper portion of the chamber 20, and the microwave introducing module 50 is configured to be fitted into each opening. The side wall 12 includes a loading/unloading port 12a for loading/unloading the substrate W to/from a transfer chamber (not shown) adjacent to the chamber 20. A gate valve G is disposed between the chamber 20 and the transfer chamber (not shown). The gate valve G has a function of opening and closing the loading/unloading port 12a. The gate valve G hermetically seals the chamber 20 in a closed state and enables the transfer of the substrate W between the chamber 20 and the transfer chamber in an open state.

The bottom wall 13 includes a plurality of exhaust ports 13a (two in FIG. 1). The exhaust port 13a and the exhaust device 40 are connected by an exhaust pipe 14. The exhaust device 40 has an APC valve and a high-speed vacuum pump capable of depressurizing an inner space of the chamber 20 to a predetermined vacuum level. The high-speed vacuum pump can be a turbo molecular pump or the like. The inner space of the chamber 20 is depressurized to a predetermined vacuum level by operating the high-speed vacuum pump of the exhaust device 40.

The plasma processing apparatus 10 also has a support member 22 for supporting the mounting table 21 in the chamber 20, and an insulating member 23 provided between the support member 22 and the bottom wall 13. The mounting table 21 is for horizontally mounting the substrate W. The substrate W is lifted by a lift pin 19 raised by a lifting/lowering drive mechanism (not shown) at the time of loading and unloading, and the substrate W is transferred between a transport mechanism and the mounting table 21. The support member 22 has a cylindrical shape extending from the center of the bottom wall 13 toward the inner space of the chamber 20. The mounting table 21 and the support member 22 are formed of, for example, aluminum having a surface to which an alumite treatment (anodic oxidation treatment) has been applied.

The plasma processing apparatus 10 also has a high frequency bias power supply 25 for supplying high frequency power to the mounting table 21, and a matcher 24 provided between the mounting table 21 and the high frequency bias power supply 25. The high frequency bias power supply 25 applies the high frequency power to the mounting table 21 in order to attract ions to the substrate W. The matcher 24 has a circuit for matching output impedance of the high frequency bias power supply 25 with impedance of a load side (the mounting table 21 side).

The plasma processing apparatus 10 may further include a temperature control device (not shown) for heating or cooling the mounting table 21. For example, the temperature control device controls a temperature of the substrate W within a range of 25° C. (room temperature) to 900° C.

The gas supply mechanism 30 includes a gas supply device 3a including a gas supply source 31 and a pipe 32 connecting the gas supply source 31 and a plurality of gas nozzles 2 to each other. In addition, although the gas supply device 3a is shown as having one gas supply source 31 in FIG. 1, the gas supply device 3a may include a plurality of gas supply sources depending on the type of gas used.

The gas supply device 3a also includes a mass flow controller and an on/off valve that are not shown and provided in the middle of the pipe 32. The type of gas supplied into the chamber 20 and a flow rate of the gas are controlled by the mass flow controller and the on/off valve.

A plurality of gas nozzles 2 extending from the pipe 32 have a cylindrical shape, pass through the ceiling wall 11, and protrude vertically from the bottom surface 11a of the ceiling wall 11. The gas nozzle 2 supplies a processing gas or the like into the chamber 20 from a gas supply hole 2a at the tip thereof. For example, when forming a silicon nitride film, silane gas ($SiH_4$) and a rare gas such as nitrogen gas ($N_2$) and argon gas (Ar) are introduced into the chamber 20 from the gas supply hole 2a. The plurality of gas nozzles 2 may be provided on the side wall 12.

The microwave introducing module 50 includes a microwave output part 51, an antenna unit 60, and a microwave radiator 63. The microwave output part 51 distributes the microwaves to a plurality of paths and outputs the microwaves. The antenna unit 60 amplifies the microwaves output from the microwave output part 51 and introduces the microwaves to the microwave radiator 63.

The antenna unit 60 includes a plurality of antenna modules 61. In the embodiment, configurations of the plurality of antenna modules 61 are all the same. Each antenna module 61 has an amplifier 62 for mainly amplifying and outputting the distributed microwaves and a microwave introducing mechanism for introducing the microwaves output from the amplifier 62 into the microwave radiator 63.

One microwave radiator 63 is disposed in the center of the ceiling wall 11 and six microwave radiators 63 are disposed at the outer circumference of the ceiling wall 11 and radiate microwaves into the chamber 20. Seven microwave radiators 63 are disposed in the opening of the ceiling wall 11.

The microwave radiator 63 includes a tuner for matching impedance and an antenna part 65 for radiating the amplified microwaves into the chamber 20. In addition, the microwave radiator 63 is made of a metal material and has a cylindrical main body container 66 extending in a vertical direction and an inner conductor 67 that extends in the same direction as a direction in which the main body container 66 extends in the main body container 66. The main body container 66 and the inner conductor 67 constitute a coaxial tube. The main body container 66 constitutes an outer conductor of this coaxial tube. The inner conductor 67 has a rod shape or a cylindrical shape. A space between an inner circumferential surface of the main body container 66 and an outer circumferential surface of the inner conductor 67 becomes a microwave transmission path 68.

The antenna part 65 includes a microwave retardation member 72 connected to a lower end of the inner conductor 67, a planar antenna 71 in contact with a lower surface of the microwave retardation member 72, and a microwave transmitting plate 1 in contact with a lower surface of the planar antenna 71. The microwave transmitting plate 1 is fitted into the opening of the ceiling wall 11 via the main body container 66, and a lower surface thereof is exposed to the inner space of the chamber 20. The microwave transmitting plate 1 functions as a microwave transmission window.

The planar antenna 71 has a disk shape. In addition, the planar antenna 71 has a slot formed to pass through the planar antenna 71. The microwave retardation member 72 is formed of a material having a dielectric constant greater than that of a vacuum. As a material for forming the microwave retardation member 72, for example, quartz, a ceramic, a fluorine-based resin such as a polytetrafluoroethylene resin, a polyimide resin, or the like may be used. A wavelength of the microwave is lengthened in a vacuum. The microwave retardation member 72 has a function of controlling the plasma by shortening the wavelength of the microwave. In addition, a phase of the microwave is changed depending on a thickness of the microwave retardation member 72. Accordingly, by adjusting the phase of the microwave depending on the thickness of the microwave retardation member 72, it is possible to adjust so that a slot position of the planar antenna 71 becomes an antinode position of a standing wave. Accordingly, it is possible to efficiently introduce the power of the microwave into the chamber 20.

The microwave transmitting plate 1 has a cylindrical shape. The microwave transmitting plate 1 is formed of a dielectric material. As a dielectric material for forming the microwave transmitting plate 1, for example, quartz, a ceramic, or the like is used. The microwave transmitting plate 1 has a shape capable of efficiently radiating microwaves in a TE mode.

Each configuration part of the plasma processing apparatus 10 is connected to the controller 80 and is controlled by the controller 80. The controller 80 is a computer and includes a process controller including a CPU, a user interface connected to the process controller, and a storage.

The process controller is a control means for collectively controlling each configuration part related to process conditions such as temperature, pressure, gas flow rate, high frequency power for bias application, microwave output, and the like in the plasma processing apparatus 10. Each configuration part includes, for example, the high frequency bias power supply 25, the gas supply source 31, the exhaust device 40, the microwave introducing module 50, and the like.

The user interface includes a keyboard or a touch panel on which a process manager performs a command input operation for managing the plasma processing apparatus 10 and a display that visualizes and displays an operating status of the plasma processing apparatus 10.

The storage stores a control program for executing various processes executed in the plasma processing apparatus 10 under control of the process controller, a recipe in which process condition data is recorded, or the like. The process controller calls and executes an arbitrary control program or recipe from the storage as needed, such as an instruction from the user interface. Accordingly, desired processing is performed in the chamber 20 of the plasma processing apparatus 10 under the control of the process controller.

As the control program and recipe, it is possible to use, for example, one stored in a computer-readable storage medium such as a flash memory, a DVD, or a Blu-ray disc. In addition, the recipe may be transmitted at any time from another device, for example, via a dedicated line to be used online.

As a program for executing the plasma processing method according to the embodiment to be described below, it is possible to use a program stored in a computer-readable storage medium. In addition, the program for executing the plasma processing method may be transmitted at any time from another device, for example, via a dedicated line to be used online. The controller 80 has a storage medium in which the program for executing the plasma processing method is stored and executes the plasma processing method according to the embodiment in the plasma processing apparatus 10 by executing the corresponding program.

[Bottom Surface of Ceiling Wall]

Figure 2:
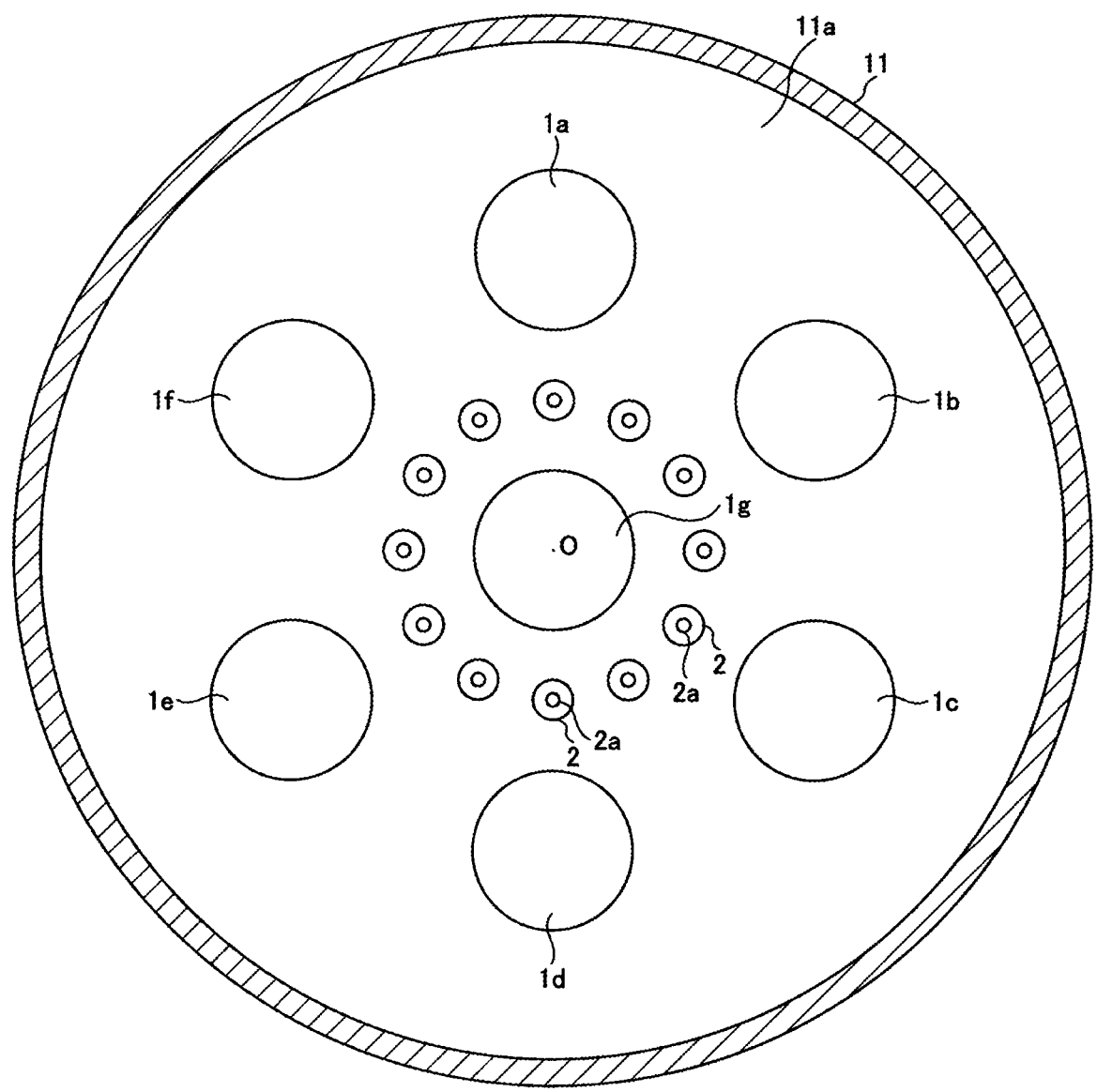
FIG. 2 is a diagram illustrating an example of a cross section taken along line II-II of FIG. 1.

Next, a microwave introducing apparatus of the bottom surface 11a of the ceiling wall 11 of the chamber 20 shown in FIG. 1 is described with reference to FIG. 2. FIG. 2 is a diagram illustrating a cross section taken along line II-II of FIG. 1 and illustrating an example of a configuration of the bottom surface 11a of the ceiling wall 11 of the chamber 20 according to the embodiment.

In the embodiment, seven microwave radiators 63 are disposed at equivalent intervals, one in the center and six at the outer circumference, and a microwave transmitting plate 1g of the central microwave radiator 63 is exposed from the bottom surface 11a in an inner circumferential region of the ceiling wall 11. In addition, microwave transmitting plates 1a to 1f of the microwave radiator 63 of an outer circumferential region are exposed from the bottom surface 11a in the outer circumferential region of the ceiling wall 11. Exposed surfaces of the microwave transmitting plates 1a to 1g are circular.

In all the microwave transmitting plates 1a to 1g, distances between center points of any three microwave transmitting plates 1 adjacent to each other are equal to each other. Twelve gas nozzles 2 are disposed at equivalent intervals in a circumferential direction between the microwave transmitting plates 1a to 1f of the outer circumferential region and the microwave transmitting plate 1g of the inner circumferential region.

The microwave introducing module 50 is an example of a plurality of plasma sources. In the embodiment, the plurality of plasma sources are microwave plasma sources and refer to seven plasma sources that radiate microwaves from each of the microwave transmitting plates 1a to 1g of the microwave introducing module 50. Hereinafter, each of the seven plasma sources of the microwave transmitting plates 1a to 1g includes each microwave radiator 63 for radiating microwaves output from the microwave output part 51. The microwave transmitting plate 1 is a generic term for the microwave transmitting plates 1a to 1g.

In addition, the plurality of plasma sources indicated by the microwave transmitting plates 1a to 1g on the bottom surface 11a of the ceiling wall 11 are provided in an inner circumferential region and an outer circumferential region of the bottom surface 11a, but the embodiment is not limited thereto. For example, at least one microwave transmitting plate 1 may be disposed in the inner circumferential region of the bottom surface 11a and at least three microwave transmitting plates 1 may be disposed in the outer circumferential region of the bottom surface 11a. The inner circumferential region of the bottom surface 11a is, for example, a region of the bottom surface 11a on the inner circumferential side of the gas nozzle 2, and the outer circumferential region of the bottom surface 11a is a region of the bottom surface 11a on the outer circumferential side of the inner circumferential region of the bottom surface 11a.

The microwaves are radiated into the chamber 20 from the microwave transmitting plates 1a to 1g and propagate as a surface wave on the bottom surface 11a of the ceiling wall 11 of the chamber 20. A standing wave may be generated by the interference of the surface wave. When the standing wave is generated, an electromagnetic field distribution of the microwave becomes non-uniform due to antinodes and nodes of the standing wave, plasma is generated non-uniformly due to this influence, and film properties such as film thickness and film quality become non-uniform in a film forming process.

For example, when a film is formed on the substrate W by turning-on all of the seven plasma sources and introducing the microwaves into the chamber 20 from all of the microwave transmitting plates 1a to 1g, non-uniformity in film thickness may occur, and a three-fold symmetric distribution in which a portion having a thin (or thick) film thickness is generated three times at every 120° angle in the circumferential direction of the substrate W may occur. Here, "n-fold symmetry" is a group of symmetries characterized by a figure. When n is an integer of 2 or more and the figure is rotated by (360/n)° around a certain center (in the case of a two-dimensional figure) or an axis (in the case of a three-dimensional figure), the feature of overlapping itself becomes the n-fold symmetry.

Figure 8:
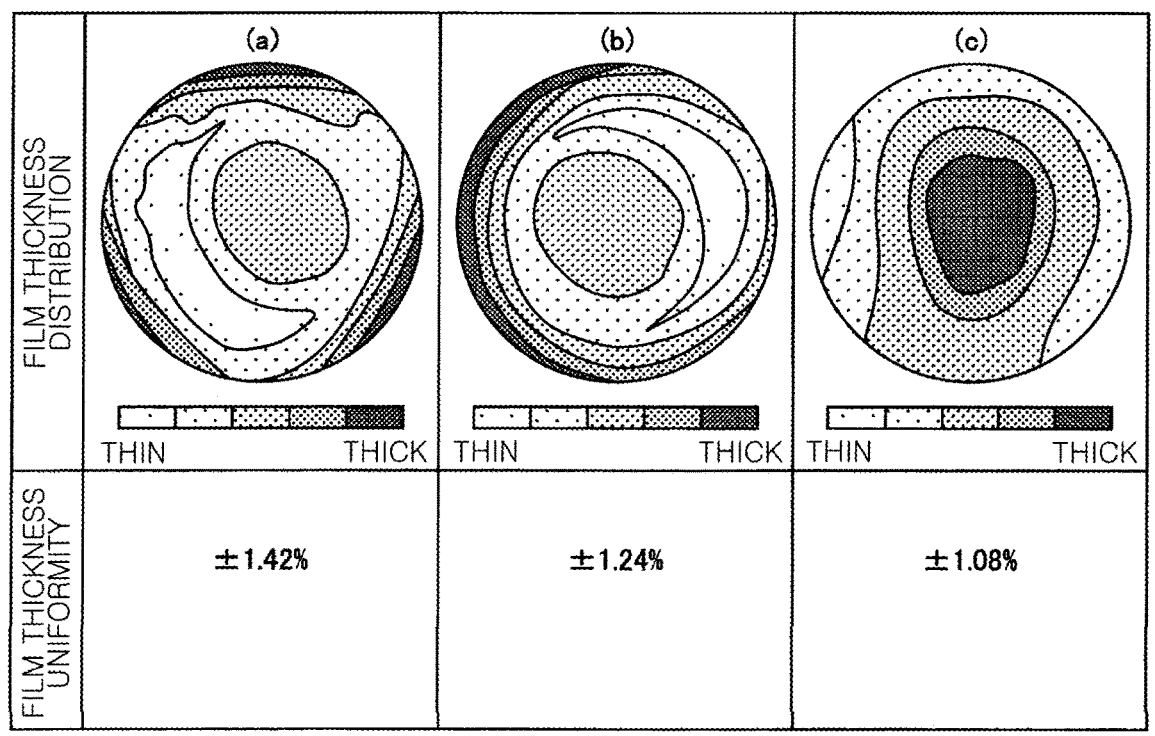

For example, in the case of n=3, as an example of three-fold symmetry, in the film formation of the substrate W facing the ceiling wall 11, the three-fold symmetric distribution in which a portion having a thin (or thick) film thickness is generated every time the outermost circumference of the substrate is rotated by a 120° angle in the circumferential direction may occur (see (a) of FIG. 8).

The cause of the three-fold symmetric distribution is considered to be the generation of standing waves due to the interference of surface waves of microwaves radiated from the respective plasma sources of the microwave transmitting plates 1a to 1g. Accordingly, we devised a plasma processing method in which one or more plasma sources of the microwave transmitting plates 1a to 1g do not radiate surface waves, a plasma source that does not radiate the surface waves is transitioned, and the film forming process is performed. Accordingly, it is possible to achieve in-plane uniformity of the substrate of plasma processing such as film properties by disrupting the standing wave of the surface wave and disrupting the three-fold symmetric distribution.

[Plasma Processing Method]

The plasma processing method according to the embodiment includes a process of controlling each of the plasma sources so that at least one plasma source among the plurality of plasma sources is in an OFF-state and the remaining plasma sources are in an ON-state and a process of processing the substrate by generating plasma from a processing gas by power output from the plurality of plasma sources.

The process of controlling each of the plasma sources is repeatedly controlled so that the plasma source in the OFF-state among the plurality of plasma sources sequentially transitions. For example, the process of controlling each of the plasma sources may be repeatedly controlled so that the plasma source in the OFF-state among the plurality of plasma sources disposed in the outer circumferential region sequentially transitions to an n-fold symmetric position. "The plasma source in the OFF-state sequentially transitions to the n-fold symmetric position" means, for example, that when rotating by $(360/n)°$ around a center point O of the ceiling wall 11 of FIG. 2, the plasma source in the OFF-state sequentially transitions to a position that overlaps a position of the plasma source in the OFF-state.

The plasma source in the OFF-state transitions to another plasma source in the outer circumferential region at predetermined time intervals. In addition, in order not to continue an extreme non-uniform state of an electromagnetic field distribution, it is controlled so that the plasma source in the OFF-state does not maintain the OFF-state continuously after the predetermined time has elapsed. That is, it is controlled so as not to create a plasma source that is in the OFF-state continuously before and after switching between the ON-state and the OFF-state.

Example

Figure 3A:
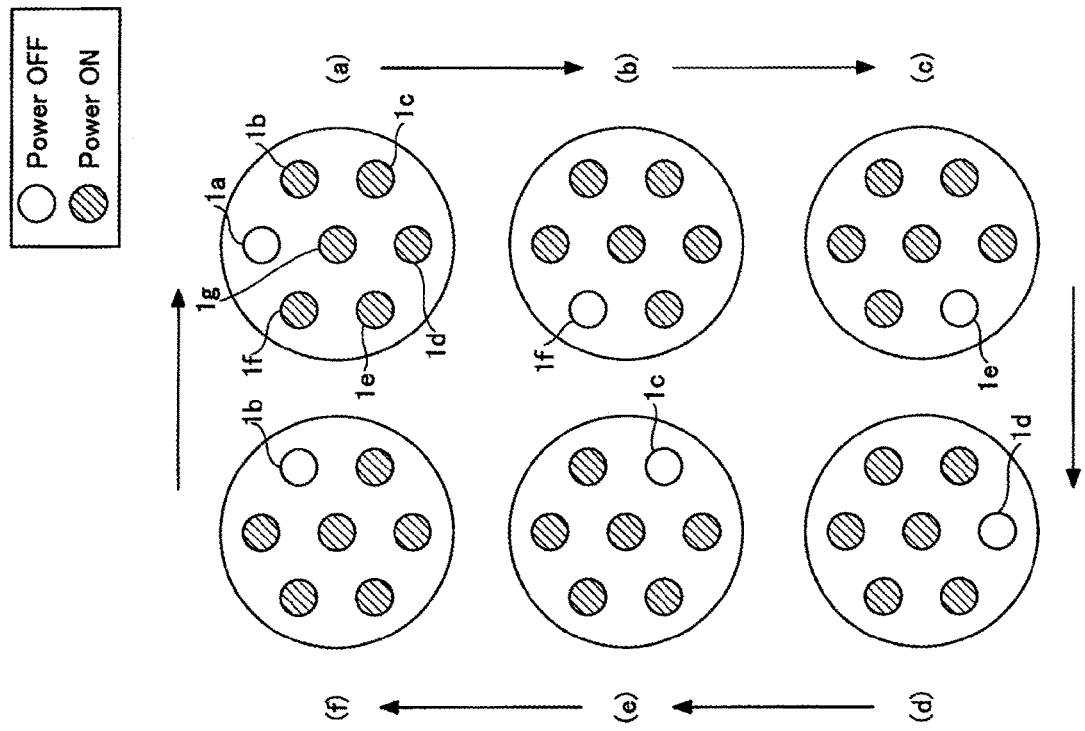
FIGS. 3A and 3B are diagrams for describing sequences of Examples 1 and 2 of a plasma processing method according to an embodiment.
Figure 3B:
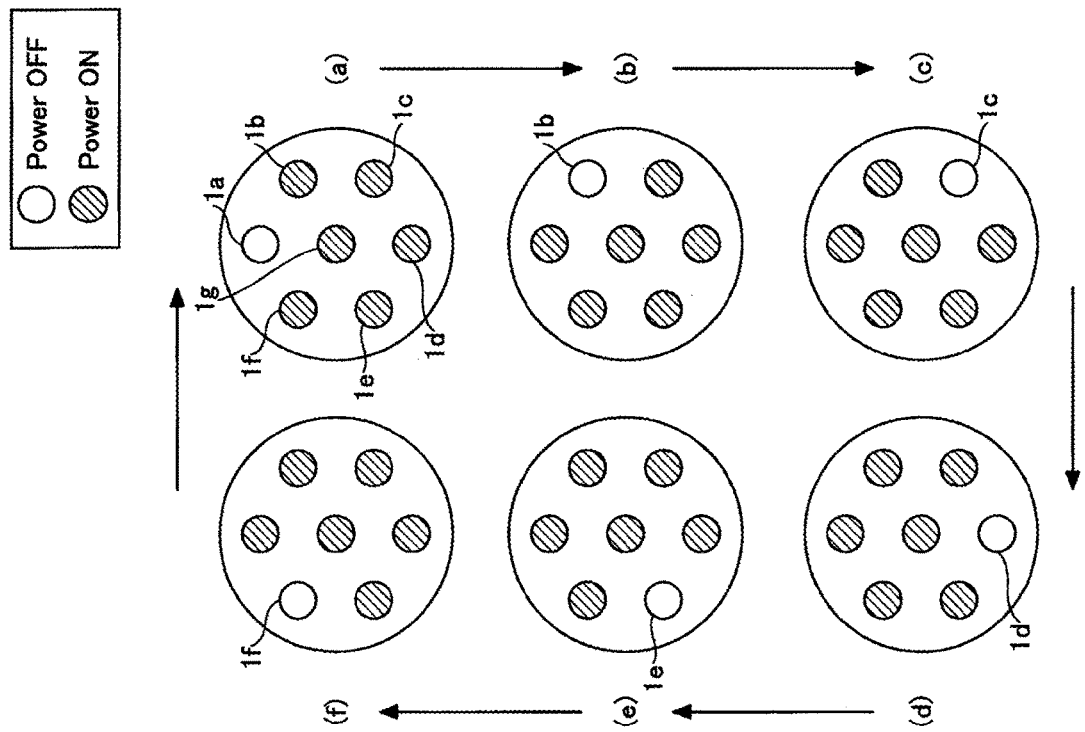
Figure 4:
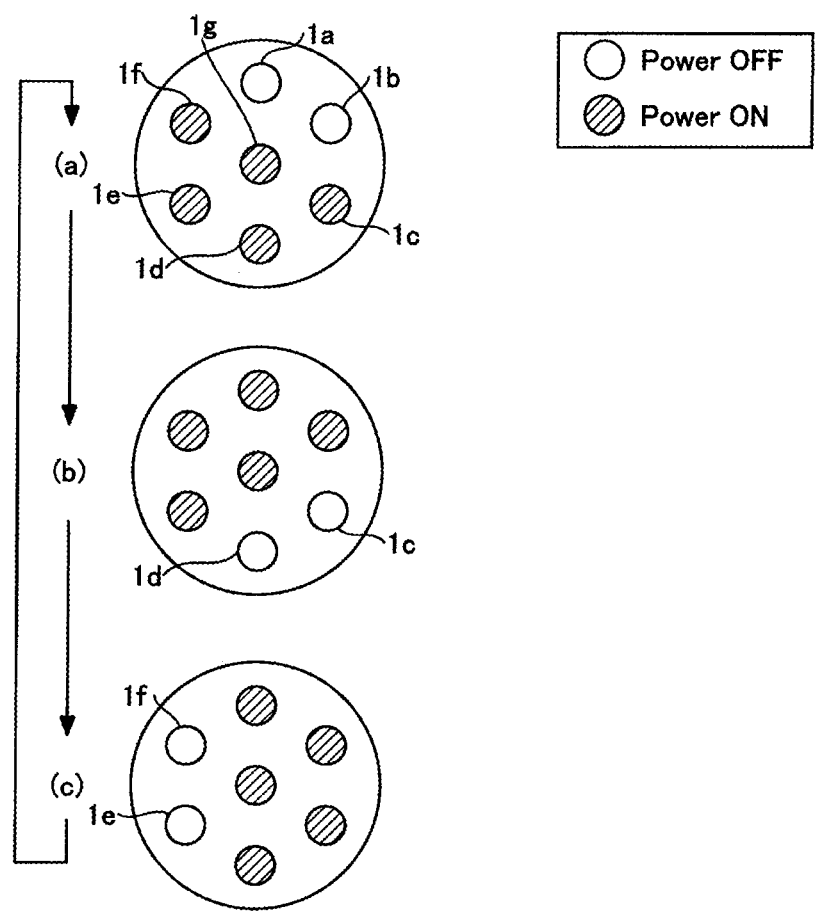
FIG. 4 is a diagram for describing a sequence of Example 3 of the plasma processing method according to the embodiment.
Figure 5:
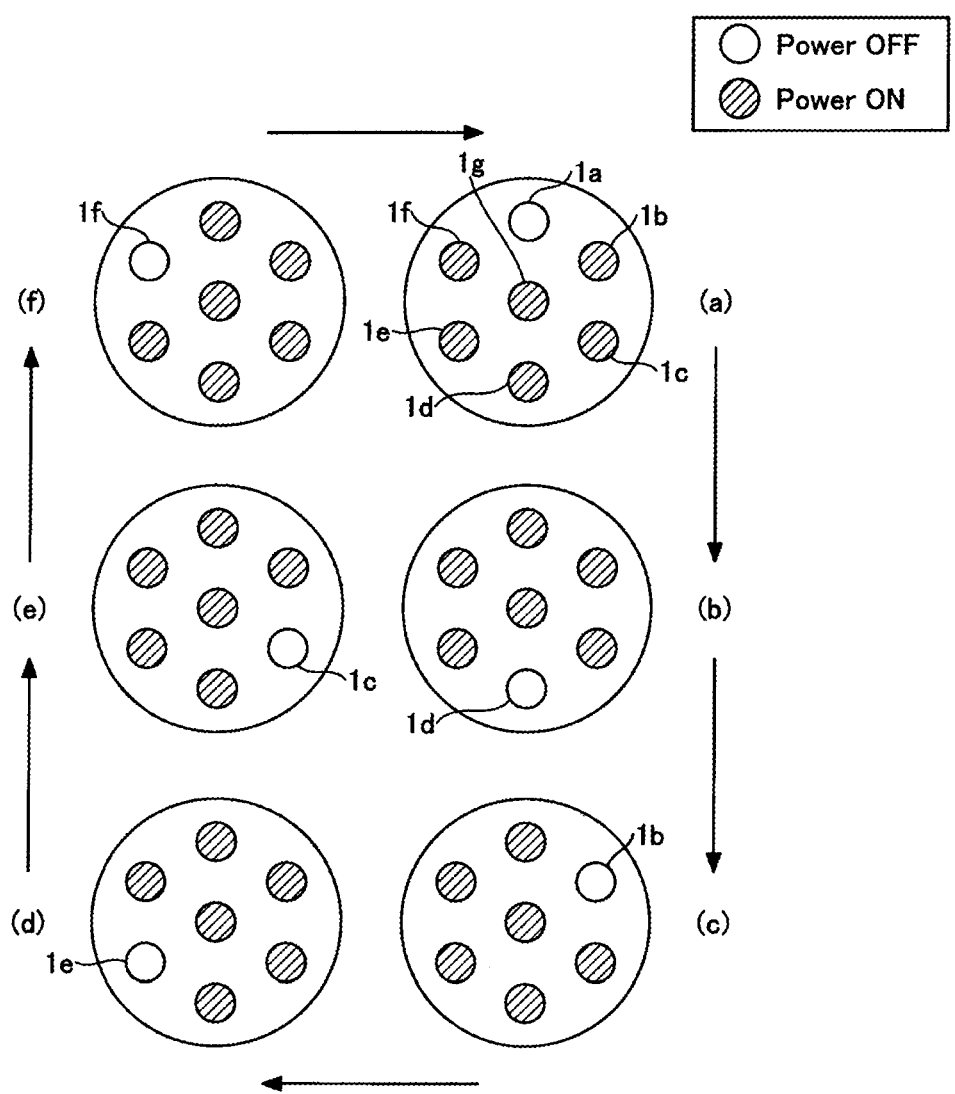
FIG. 5 is a diagram for describing a sequence of Example 4 of the plasma processing method according to the embodiment.

Examples of a plasma processing method according to an embodiment described above will be described with reference to FIGS. 3 to 5. FIGS. 3 to 5 are diagrams for describing a sequence of each Example of the plasma processing method according to the embodiment. The plasma processing method of each Example is executed by the controller 80.

Example 1: FIG. 3A

First, Example 1 of the plasma processing method according to the embodiment will be described with reference to FIG. 3A. FIG. 3A shows Example 1 as an example of the plasma processing method according to the embodiment.

In FIG. 3A, colors of the microwave transmitting plates 1a to 1g of the bottom surface 11a of the ceiling wall 11 are indicated by white circles and black circles, whereby an ON/OFF-state of the power of the microwave output from each plasma source of the microwave transmitting plates 1a to 1g is indicated. The white circle represents that the power is off, and the black circle represents that the power is on.

In the plasma processing method according to Example 1, as shown in FIG. 3A, a cycle is repeated with (a)→(b)→(c)→(d)→(e)→(f) as one cycle, and it is controlled so that the plasma source in the OFF-state is sequentially transitioned at predetermined time intervals.

In the plasma processing method according to Example 1, first, it is controlled so that the plasma source of the microwave transmitting plate 1a is in the OFF-state and the plasma sources of the remaining microwave transmitting plates 1b to 1g are in the ON-state in (a).

After a predetermined time (hereinafter, referred to as a predetermined time) has elapsed, it is controlled so that the plasma source of the microwave transmitting plate 1b is in the OFF-state and the plasma sources of the remaining microwave transmitting plates 1a and 1c to 1g are in the ON-state in (b). After a following predetermined time has elapsed, it is controlled so that the plasma source of the microwave transmitting plate 1c is in the OFF-state and the plasma sources of the remaining microwave transmitting plates 1a, 1b, and 1d to 1g are in the ON-state in (c).

After a following predetermined time has elapsed, it is controlled so that the plasma source of the microwave transmitting plate 1d is in the OFF-state and the plasma sources of the remaining microwave transmitting plates 1a to 1c and 1e to 1g are in the ON-state in (d). After a following predetermined time has elapsed, it is controlled so that the plasma source of the microwave transmitting plate 1e is in the OFF-state and the plasma sources of the remaining microwave transmitting plates 1a to 1d, 1f, and 1g are in the ON-state in (e).

After a following predetermined time has elapsed, it is controlled so that the plasma source of the microwave transmitting plate 1f is in the OFF-state and the plasma sources of the remaining microwave transmitting plates 1a to 1e and 1g are in the ON-state in (f). After a predetermined time has elapsed, the cycle returns to (a) again, and it is controlled so that the plasma source of the microwave transmitting plate 1a is in the OFF-state and the plasma sources of the remaining microwave transmitting plates 1b to 1g are in the ON-state.

In Example 1, one plasma source among the plasma sources of the microwave transmitting plates 1a to 1f in the outer circumferential region is in the OFF-state, and the plasma source in the OFF-state sequentially transitions clockwise to an adjacent plasma source in the ON-state at predetermined time intervals. Accordingly, it is repeatedly controlled so that the plasma source in the OFF-state sequentially transitions to the n(n=6)-fold symmetric position. In other words, it is controlled so that the position of the plasma source in the OFF-state sequentially transitions to a position where the angle is 60° clockwise with respect to the center point O of the bottom surface 11a of the ceiling wall 11 of FIG. 2. Accordingly, it is possible to create a situation in which a surface wave of microwaves is not radiated from any one plasma source, and to perform the film forming process by transitioning a plasma source that does not radiate the surface wave. As a result, it is possible to achieve uniformity of the film properties by disrupting the standing wave of the surface wave on the bottom surface 11a and losing or disrupting the three-fold symmetric distribution.

Example 2: FIG. 3B

Next, Example 2 of the plasma processing method according to the embodiment will be described with reference to FIG. 3B. FIG. 3B shows Example 2 as an example of the plasma processing method according to the embodiment.

In the plasma processing method according to Example 2, one plasma source among the plasma sources of the microwave transmitting plates 1a to 1f in the outer circumferential region is in the OFF-state, and the position of the plasma source in the OFF-state sequentially transitions counterclockwise to an adjacent plasma source in the ON-state at predetermined time intervals. A difference from Example 1 is only that when the position of the plasma source in the OFF-state transitions, the position of the plasma source transitions clockwise or counterclockwise.

Also, in the plasma processing method according to Example 2, it is repeatedly controlled so that the plasma source in the OFF-state sequentially transitions to the n(n=6)-fold symmetric position. Accordingly, a situation is created in which a surface wave of microwaves is not radiated from any one plasma source, and the film forming process is performed by transitioning a plasma source that does not radiate the surface wave. Accordingly, it is possible to achieve uniformity of the film properties by disrupting the standing wave of the surface wave and losing or disrupting the three-fold symmetric distribution.

Example 3: FIG. 4

Next, Example 3 of the plasma processing method according to the embodiment will be described with reference to FIG. 4. FIG. 4 shows Example 3 as an example of the plasma processing method according to the embodiment.

In the plasma processing method according to Example 3, as shown in FIG. 4, a cycle is repeated with (a)→(b)→(c) as one cycle, and it is controlled so that the plasma sources in the OFF-state sequentially transition at predetermined time intervals.

In the plasma processing method according to Example 3, first, it is controlled so that the plasma sources of two adjacent microwave transmitting plates 1a and 1b are in the OFF-state and the plasma sources of the remaining microwave transmitting plates 1c to 1g are in the ON-state in (a).

After a predetermined time has elapsed, it is controlled so that the plasma sources of two microwave transmitting plates 1c and 1d are in the OFF-state and the plasma sources of the remaining microwave transmitting plates 1a, 1b, and 1e to 1g are in the ON-state in (b). After a following predetermined time has elapsed, it is controlled so that the plasma sources of two microwave transmitting plates 1e and 1f are in the OFF-state and the plasma sources of the remaining microwave transmitting plates 1a to 1d and 1g are in the ON-state in (c).

After a following predetermined time has elapsed, the cycle returns to (a) again, and it is controlled so that the plasma sources of the two microwave transmitting plates 1a and 1b are in the OFF-state and the plasma sources of the remaining microwave transmitting plates 1c to 1g are in the ON-state.

In the plasma processing method according to Example 3, two adjacent plasma sources among the plasma sources of the microwave transmitting plates 1a to 1f in the outer circumferential region are in the OFF-state, and the positions of the plasma sources in the OFF-state sequentially transition clockwise to two adjacent plasma sources in the ON-state at predetermined time intervals. Accordingly, it is repeatedly controlled so that the plasma source in the OFF-state sequentially transitions to the n(n=3)-fold symmetric position. Accordingly, a situation is created in which two plasma sources do not radiate surface waves, and the film forming process is performed by transitioning two plasma sources that do not radiate the surface waves to the n-fold symmetric position. Accordingly, it is possible to disrupt the standing wave of the surface wave, and to achieve uniformity of the film properties.

In addition, in Example 3, two plasma sources among the plasma sources of the microwave transmitting plates 1a to 1f in the outer circumferential region are in the OFF-state, and the plasma sources in the OFF-state sequentially transition clockwise to adjacent plasma sources in the ON-state at predetermined time intervals, but the embodiment is not limited thereto. For example, two plasma sources in the OFF-state may sequentially transition counterclockwise to adjacent plasma sources in the ON-state at predetermined time intervals.

Example 4: FIG. 5

Next, Example 4 of the plasma processing method according to the embodiment will be described with reference to FIG. 5. FIG. 5 shows Example 4 as an example of the plasma processing method according to the embodiment.

In the plasma processing methods according to Examples 1 and 2, a sequence is executed in which one plasma source among a plurality of plasma sources in the outer circumferential region is in the OFF-state and a position of a next plasma source in the OFF-state sequentially transitioned clockwise or counterclockwise to an adjacent plasma source to perform the film formation process.

On the other hand, in the plasma processing method according to Example 4, as shown in FIG. 5, a plasma source at a position facing the plasma source in a current OFF-state is controlled so as to be in the OFF-state next. The reason is that the film thickness on the substrate W tends to decrease below the plasma source in an initial OFF-state, and thus when the plasma source controlled to be in the OFF-state next is set to an adjacent plasma source, the film thickness near a lower side of the plasma source in initially OFF-state tends to be thin. In Example 4, a plasma source at a position facing the plasma source in the OFF-state, that is, a plasma source at a position farthest from the plasma source in the OFF-state is in the OFF-state next. Accordingly, it is possible to suppress the tendency for the film thickness to become thin near the lower side of the plasma source in an initial OFF-state and improve the uniformity of the film thickness.

Specifically, in the plasma processing method according to Example 4, first, it is controlled so that the plasma source of the microwave transmitting plate 1a is in the OFF-state and the plasma sources of the remaining microwave transmitting plates 1b to 1g are in the ON-state in (a) of FIG. 5.

After a predetermined time has elapsed, it is controlled so that the plasma source of the microwave transmitting plate 1d facing the plasma source of the microwave transmitting plate 1a is in the OFF-state and the plasma sources of the remaining microwave transmitting plates 1a to 1c, and 1e to 1g are in the ON-state in (b). After a following predetermined time has elapsed, it is controlled so that the plasma source of the microwave transmitting plate 1b adjacent to the microwave transmitting plate 1a facing the plasma source of the microwave transmitting plate 1d is in the OFF-state and the plasma sources of the remaining microwave transmitting plates 1a and 1c to 1g are in the ON-state in (c).

After a following predetermined time has elapsed, it is controlled so that the plasma source of the microwave transmitting plate 1e facing the plasma source of the microwave transmitting plate 1b is in the OFF-state and the plasma sources of the remaining microwave transmitting plates 1a to 1d, 1f, and 1g are in the ON-state in (d). After a following predetermined time has elapsed, it is controlled so that the plasma source of the microwave transmitting plate 1c adjacent to the microwave transmitting plate 1b facing the plasma source of the microwave transmitting plate 1e is in the OFF-state and the plasma sources of the remaining microwave transmitting plates 1a, 1b, and 1d to 1g are in the ON-state in (e).

After a following predetermined time has elapsed, it is controlled so that the plasma source of the microwave transmitting plate 1f facing the plasma source of the microwave transmitting plate 1c is in the OFF-state and the plasma sources of the remaining microwave transmitting plates 1a to 1e and 1g are in the ON-state in (f). After a following predetermined time has elapsed, the cycle returns to (a) again, and it is controlled so that the plasma source of the microwave transmitting plate 1a is in the OFF-state and the plasma sources of the remaining microwave transmitting plates 1b to 1g are in the ON-state.

In Example 4, one plasma source among the plasma sources of the microwave transmitting plates 1a to 1f in the outer circumferential region is in the OFF-state, and the plasma source in the OFF-state sequentially transitions to the plasma source in the ON-state at a facing position at predetermined time intervals. By repeating this, it is repeatedly controlled so that the plasma source in the OFF-state sequentially transitions to a position furthest from the plasma source in the OFF-state among six plasma sources in the outer circumferential region. However, in the case of transition from (b) to (c) and from (d) to (e) of FIG. 5, when returning to the facing position (an angle of 180° from the plasma source in the OFF-state), the plasma source in the OFF-state may not sequentially transition because the plasma source that was in the OFF-state last time is turned off again. Therefore, the plasma source adjacent to the plasma source at the angle of 180° from the plasma source in the OFF-state is controlled to be in the OFF-state. In Example 4, in the case of transition from (b) to (c), the plasma source of the microwave transmitting plate 1b on a right side of the plasma source of the microwave transmitting plate 1a in the facing position is controlled to be in the OFF-state. However, the embodiment is not limited thereto, and the plasma source of the microwave transmitting plate 1f on a left side of the plasma source of the microwave transmitting plate 1a may be controlled to be in the OFF-state. In this case, instead of controlling the plasma source to be in the OFF-state in the order of (a)→(b)→(c)→(d)→(e)→(f) of FIG. 5, the plasma source is controlled in the OFF-state in the order of (a)→(b)→(f)→(e)→(d)→(c). As described above, when the facing position of the plasma source in the OFF-state is the plasma source previously controlled in the OFF-state, any one of the plasma sources adjacent to the plasma source controlled in the OFF-state is controlled to be in the OFF-state, and the plasma sources in the outer circumferential region are repeatedly controlled to be in a sequential OFF-state.

Accordingly, by selecting the farthest position from the plasma source that was in the OFF-state immediately before for a position at which the surface waves of the microwaves are not radiated to the plasma source, the plasma source that does not radiate the surface waves of the microwaves transitions to a position farthest from the plasma source that does not radiate the surface wave immediately before and performs the film forming process. Accordingly, it is possible to effectively disrupt the standing wave of the surface wave, and to achieve the uniformity of the film properties. In particular, in the plasma processing method according to Example 4, the uniformity of the film thickness may be further improved by controlling so that the plasma source in the OFF-state sequentially transitions to positions facing six plasma sources in the outer circumferential region.

In the plasma processing method according to Example 4, when the number of plasma sources in the outer circumferential region is an even number such as six, and when the facing position of the plasma source in the OFF-state is the plasma source previously controlled in the OFF-state, any one of the plasma sources adjacent to the plasma source controlled in the OFF-state is controlled to be in the OFF-state. Also in this case, the plasma source at the facing position of the plasma source in the OFF-state is controlled to a position farthest from the plasma source in the OFF-state as the n-fold symmetric position. Therefore, it is included in the control of sequentially transitioning the plasma source in the OFF-state to the n-fold symmetric position.

Meanwhile, when the number of plasma sources in the outer circumferential region is an odd number, the plasma source in the OFF-state, and any one of the plasma sources at the position farthest from the plasma source in the OFF-state is controlled to be in the OFF-state. Also in this case, the plasma source at the facing position of the plasma source in the OFF-state is controlled to the position farthest from the plasma source in the OFF-state as the n-fold symmetric position. Therefore, it is included in the control of sequentially transitioning the plasma source in the OFF-state to the n-fold symmetric position.

Figure 6:
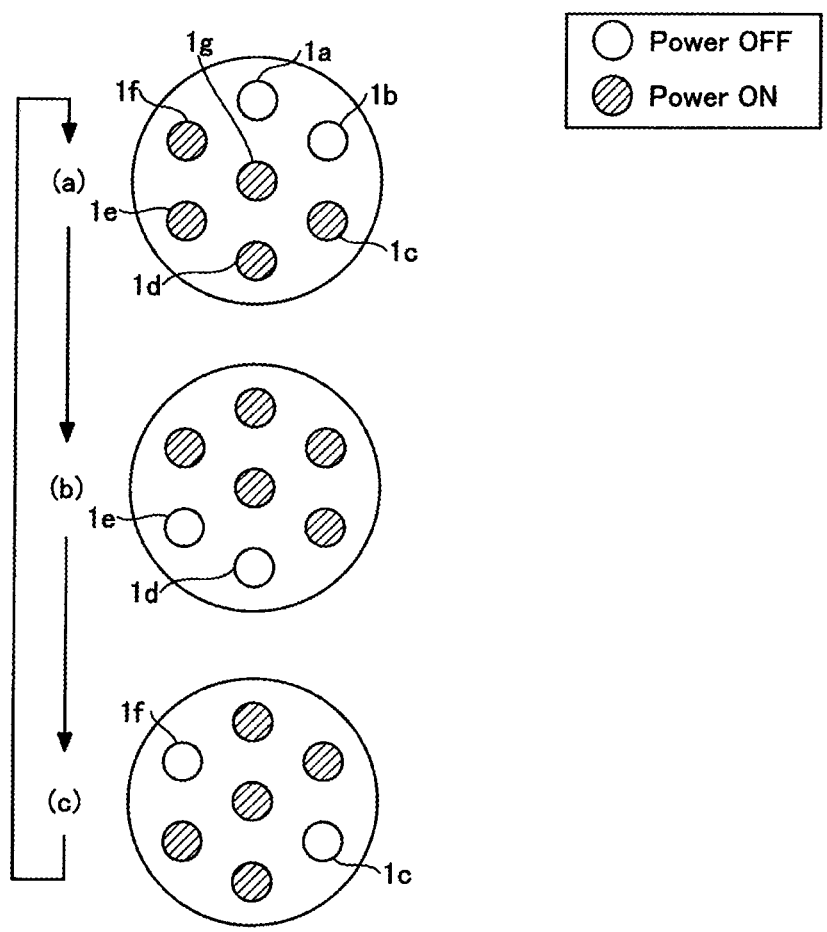
FIG. 6 is a diagram for describing a sequence of Example 5 of the plasma processing method according to the embodiment.

Example 5: FIG. 6

Next, a plasma processing method according to Example 5 will be described with reference to FIG. 6. FIG. 6 shows Example 5 as an example of the plasma processing method according to the embodiment.

In the plasma processing method according to Example 5, two plasma sources among the plasma sources of the microwave transmitting plates 1a to 1f in the outer circumferential region are in the OFF-state at predetermined time intervals and sequentially transition. In Example 5, as shown in FIG. 6, a cycle is repeated with (a)→(b)→(c) as one cycle, and it is controlled so that the plasma source in the OFF-state sequentially transitions at predetermined time intervals.

In the plasma processing method according to Example 5, first, it is controlled so that the plasma sources of two adjacent microwave transmitting plates 1a and 1b are in the OFF-state and the plasma sources of the remaining microwave transmitting plates 1c to 1g are in the ON-state in (a).

After a predetermined time has elapsed, it is controlled so that the plasma sources of two microwave transmitting plates 1d and 1e facing the microwave transmitting plates 1a and 1b are in the OFF-state and the plasma sources of the remaining microwave transmitting plates 1a to 1b, 1f, and 1g are in the ON-state in (b). After a following predetermined time has elapsed, it is controlled so that the plasma sources of two microwave transmitting plates 1c and 1f are in the OFF-state and the plasma sources of the remaining microwave transmitting plates 1a, 1b, 1d, 1e, and 1g are in the ON-state in (c).

After a following predetermined time has elapsed, the cycle returns to (a) again, and it is controlled so that the plasma sources of the two microwave transmitting plates 1a and 1b are in the OFF-state and the plasma sources of the remaining microwave transmitting plates 1c to 1g are in the ON-state.

In the case of Example 5, power efficiency that may be input per unit time is lower than that of Example 4. In addition, the n-fold symmetry control is not performed, and the transition is close to point symmetry. Accordingly, although the control of Example 5 is inferior to that of Example 4, it is possible to disrupt the three-fold symmetric distribution and improve the uniformity of the film characteristic even by the control of Example 5.

Figure 7:
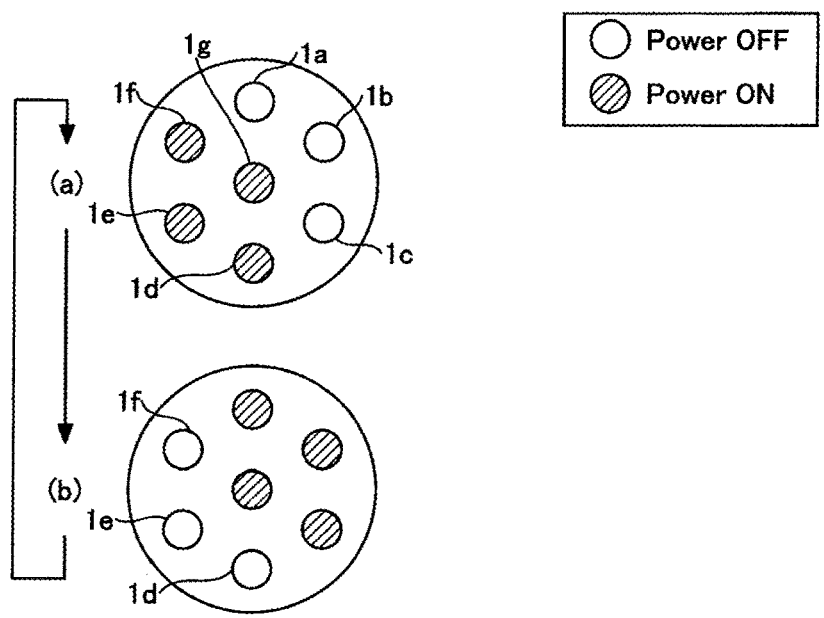
FIG. 7 is a diagram for describing a sequence of Example 6 of the plasma processing method according to the embodiment.

Example 6: FIG. 7

Next, Example 6 of the plasma processing method according to the embodiment will be described with reference to FIG. 7. FIG. 7 shows Example 6 as an example of the plasma processing method according to the embodiment.

In Example 6, as shown in FIG. 7, a cycle is repeated with (a)→(b) as one cycle, and it is controlled so that the plasma sources in the OFF-state sequentially transition at predetermined time intervals.

In the plasma processing method according to Example 6, first, it is controlled so that the plasma sources of three adjacent microwave transmitting plates 1a, 1b, and 1c are in the OFF-state and the plasma sources of the remaining microwave transmitting plates 1d to 1g are in the ON-state in (a).

After a predetermined time has elapsed, it is controlled so that the plasma sources of three microwave transmitting plates 1d, 1e, and 1f are in the OFF-state and the plasma sources of the remaining microwave transmitting plates 1a, 1b, 1c, and 1g are in the ON-state in (b). After a following predetermined time has elapsed, the cycle returns to (a) again, and it is controlled so that the plasma sources of the three microwave transmitting plates 1a, 1b, and 1c are in the OFF-state and the plasma sources of the remaining microwave transmitting plates 1d to 1g are in the ON-state.

In Example 6, three adjacent plasma sources among the plasma sources of the microwave transmitting plates 1a to 1f in the outer circumferential region are in the OFF-state, and the plasma sources in the OFF-state sequentially transition to the three adjacent plasma sources in the ON-state at predetermined time intervals. By repeating this, it is repeatedly controlled so that the plasma sources in the OFF-state sequentially transition to the n(n=2)-fold symmetric position. Accordingly, a situation is created in which the three plasma sources do not radiate surface waves, and the film forming process is performed by transitioning the plasma sources that do not radiate the surface waves. Accordingly, it is possible to disrupt the standing wave of the surface wave.

However, since it is also a method of point-symmetric transition except for the central plasma source 1g and a region of the plasma source in the OFF-state is large, there is a case in which some unevenness occurs in the uniformity of the film quality. Therefore, although the control of Example 6 is inferior to that of Example 4, it is possible to disrupt the three-fold symmetric distribution and improve the uniformity of the film characteristic even by the control of Example 6.

In Examples 1 to 6, it is controlled so that the plasma source in the OFF-state is changed at predetermined time intervals and there is no plasma source in the OFF-state continuously even after a predetermined time has elapsed. Therefore, when there are six plasma sources in the outer circumferential region, turning off four or more plasma sources in the outer circumferential region at the same time is not performed because a plasma source in the OFF-state continuously is present even after a predetermined time has elapsed.

In addition, in Examples 1 to 6, the number of integrations of the plasma sources in the OFF-state in one cycle is the same regardless of the number of plasma sources that are simultaneously controlled to be in the OFF-state. That is, the number of integrations of on/off in one cycle of the plasma source controlled to be on/off is the same. In addition, from the viewpoint of power input efficiency, it is better to have as few plasma sources in the OFF-state as possible.

[Experimental Verification]

As described above, in the plasma processing methods according to Examples 1 to 6, the three-fold symmetric distribution, that is, a distribution that a high film thickness distribution in the circumferential direction at the outermost circumference of the substrate is present at three places at approximately equivalent intervals may be eliminated.

Figure 9:
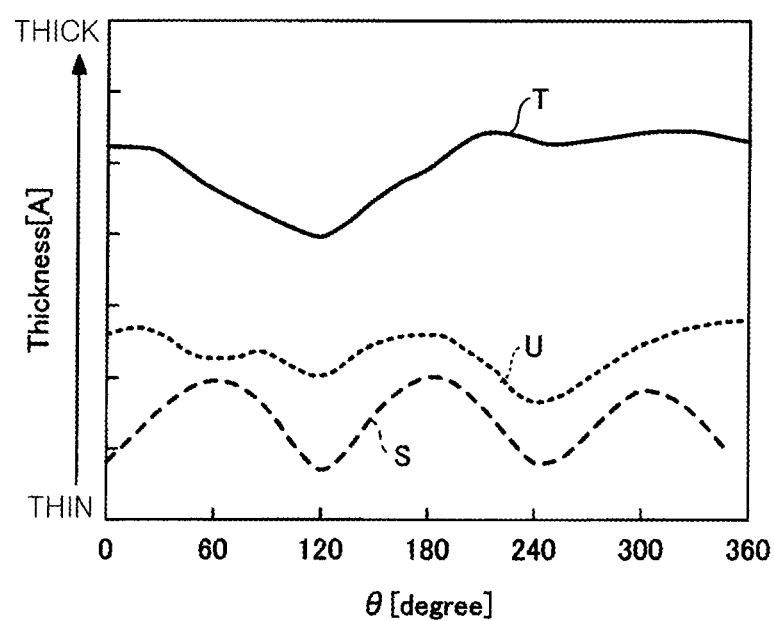

The inventor conducted an experiment to execute the plasma processing methods according to Examples 2 and 4 in the plasma processing apparatus 10, and verified that the three-fold symmetric distribution may be eliminated by using the plasma processing method according to the embodiment. The experimental verification results will be described with reference to FIGS. 8 and 9. FIGS. 8 and 9 are diagrams illustrating experimental results of Examples 2 and 4 of the plasma processing method according to the embodiment and an example of the experimental results when all the plasma sources are in the ON-state. In addition, the plasma source of the central microwave transmitting plate 1g was always controlled to be in the ON-state.

(a) of FIG. 8 shows an example of a thickness distribution of the film formed on the substrate W as a result of executing the film forming process by controlling all the plasma sources of the seven microwave transmitting plates 1a to 1g to be in the ON-state. At the outermost circumference of the substrate W, the three-fold symmetric distribution, which is a phenomenon in which a high film thickness distribution in the circumferential direction occurs at three places at approximately equivalent intervals at every angle of 120°, occurred.

(b) of FIG. 8 is an example of the plasma processing method according to the embodiment and shows an example of the thickness distribution of the film formed on the substrate W as a result of executing the plasma processing method according to Example 2. At the outermost circumference of the substrate W, the three-fold symmetric distribution in the circumferential direction did not occur.

(c) of FIG. 8 is an example of the plasma processing method according to the embodiment and shows an example of the thickness distribution of the film formed on the substrate W as a result of executing the plasma processing method according to Example 4. The three-fold symmetric distribution in the circumferential direction did not occur.

FIG. 9 is a graph illustrating the thickness distribution of the film formed on the substrate W shown in (a) to (c) of FIG. 8. The film thickness is measured on a circumference of a circle with a radius of 147 mm and concentric with the substrate W. The horizontal axis in FIG. 9 shows a rotation degree of a corresponding position from the 12 o'clock position of the substrate, and the vertical axis shows the film thickness formed at the time of film formation of the substrate W.

Line S represents a film thickness distribution of (a) of FIG. 8 when all the plasma sources are controlled to be in the ON-state, line T shows a film thickness distribution of (b) of FIG. 8 in the case of Example 2, and line U represents a film thickness distribution of (c) of FIG. 8 in the case of Example 4. As shown in line S, when all the plasma sources were controlled in the ON-state, there were three peaks in a range of 0° to 360°, and the three-fold symmetric distribution occurred.

On the other hand, in line T of Example 2 and line U of Example 4, control was repeated, in which the plasma source in the OFF-state among six plasma sources in the outer circumferential region sequentially transitioned to another plasma source at predetermined time intervals. Accordingly, five or six plasma sources in the ON-state among the plasma sources in the outer circumferential region are present asymmetrically with respect to the center point O of the substrate W (see FIG. 2), and it was possible to collapse the standing wave of the surface wave of the bottom surface 11*a* of the ceiling wall 11. As a result, the three peaks disappeared in the range of 0° to 360°, and the three-fold symmetric distribution did not occur.

Regarding the uniformity of the film thickness in the circumferential direction of 147 mm from the center of the substrate W, a degree of deviation between maximum and minimum values of the film thickness with respect to an average value of the film thickness in the circumferential direction of 147 mm from the center of the substrate W was quantified and shown in (a) to (c) of FIG. 8. It shows that a deviation in film thickness is large as a numerical value is large. As a result, the film thickness uniformity was ±1.42% when all the plasma sources were controlled in the ON-state, ±1.24% in Example 2, and ±1.08% in Example 4. As described above, in Examples 2 and 4, it was possible to improve the uniformity of the film thickness compared to the case in which all the plasma sources were controlled in the ON-state. In addition, in Example 4, the uniformity of the film thickness was able to be improved more than in Example 2.

As described above, the plasma processing method according to the embodiment was described as an example of the plasma processing apparatus 10 having the plasma source of the microwave transmitting plate 1*g* in the inner circumferential region and the plasma sources of the microwave transmitting plates 1*a* to 1*f* in the outer circumferential region. In the embodiment, control was repeated, in which one, two, and three plasma sources among the plasma sources of the microwave transmitting plates 1*a* to 1*f* in the outer circumferential region are simultaneously controlled to be in the OFF-state and the plasma sources in the OFF-state sequentially transition.

In addition, it is controlled so that plasma sources in simultaneous OFF-states among the plurality of plasma sources in the outer circumferential region are not disposed point-symmetrically. For example, a case in which the plasma sources of the microwave transmitting plates 1*a*, 1*c*, and 1*e* are controlled to be in the OFF-state at the same time is an example in which the plasma sources in the OFF-state are disposed point-symmetrically. In this case, it is repeated that the plasma sources of the microwave transmitting plates 1*b*, 1*d*, and 1*f* are controlled to be in the OFF-state after a predetermined time has elapsed to be control of the inversion pattern. In the plasma processing method according to the embodiment, the point-symmetric transition of the plasma source in the OFF-state is not so preferable. That is, it is preferable to control so that the plasma source in the OFF-state is not disposed point-symmetrically. In addition, it is preferable to control so that the arrangement pattern of the plasma source in the OFF-state and the plasma source in the ON-state does not become a pattern that is inverted at predetermined time intervals. Since a regular standing wave is generated on the bottom surface 11*a* of the ceiling wall 11, it difficult to eliminate the three-fold symmetry.

In the plasma processing method according to the embodiment, it is preferable to be able to control the position of the plasma source in the OFF-state among the plasma sources in the outer circumferential region by n-fold symmetry. Considering the viewpoint of improving the three-fold symmetric distribution and the viewpoint of efficiently inputting as much power as possible, Example 4 is the most preferable, and other than Example 4, Examples 1, and 2, Example 3, Example 5, and Example 6 are generally preferred in this order.

It is preferable that the plasma source of the central microwave transmitting plate 1*g* is controlled in the ON-state always. As shown in FIG. 2, there are twelve gas nozzles 2 around the plasma source of the central microwave transmitting plate 1*g*, which serve as a barrier to the surface wave of the microwave radiated from the microwave transmitting plate 1*g*. Therefore, it is considered that the on and off control of the plasma source of the central microwave transmitting plate 1*g* has almost no effect on the generation of the standing wave of the surface wave on the bottom surface 11*a* of the ceiling wall 11. Therefore, the on and off of the plasma sources of the microwave transmitting plates 1*a* to 1*f* in the outer circumferential region are controlled, and the plasma source of the microwave transmitting plate 1*g* is maintained in the ON-state. However, the plasma source of the central microwave transmitting plate 1*g* is not limited to the control to maintain the ON-state, and the power of microwaves radiated from the plasma source of the microwave transmitting plate 1*g* may be controlled to be changed, or the on and off may be controlled.

Each power output from each of the plasma sources may be controlled so that the total power output from all the plasma sources becomes the same. That is, it may be controlled to increase the power output from the plasma sources in the ON-state other than the OFF-state so that the total power input from all the plasma sources in the case of having the plasma sources in the OFF-state is the same as that in the case of not having the plasma sources in the OFF-state.

For example, when one plasma source among six plasma sources in the outer circumferential region is controlled in the OFF-state, the total power output from the plasma sources may be made the same by increasing each power output from the remaining five plasma sources in the outer circumferential region and the central plasma source by ⅙. However, the control to make the total power output from the plasma sources the same is an adjustment necessary when the process conditions are completed and the process conditions are set in the recipe etc., and when the process conditions are not completed, the related control does not need to be performed.

In the control that makes the total power output from the plasma sources the same, when the plasma sources are controlled to be in the OFF-state one by one, the influence of the load of the output power on the plasma sources in the ON-state may be reduced as compared with the case in which the plurality of plasma sources are controlled in the OFF-state at the same time. Meanwhile, in order to eliminate or weaken the standing wave of the surface wave generated on the bottom surface 11*a* of the ceiling wall 11, it is preferable that the number of plasma sources controlled in the OFF-state at the same time is large. In the plasma processing method according to the embodiment, the number of plasma sources to be in the OFF-state symmetrically n times and a value of n are controlled while considering the two conditions.

The predetermined time (sequential rotation speed) for transitioning the plasma source in the OFF-state is a predetermined time, but it may be variably controlled in the process of processing the substrate W based on process conditions. For example, the deviation in the film thickness distribution may be corrected by variably adjusting the predetermined time (sequential rotation speed) for transitioning the plasma source in the OFF-state. For example, when the predetermined time (sequential rotation speed) is too slow, the plasma density below the plasma source in the OFF-state decreases, and there is a possibility that the film properties such as the thickness and quality of the film formed on the substrate W are deteriorated. Therefore, the predetermined time may be variably set, for example, as a value greater than 0.1 second and smaller than 1 second. Setting the predetermined time to a value greater than 0.1 second is a limit value in terms of the configuration of the plasma processing apparatus 10, and setting the predetermined time to a value smaller than 1 second is for controlling film properties such as film thickness and film quality within an allowable range.

In the above description, the plasma processing method performed in the plasma processing apparatus having the plurality of plasma sources has the process of controlling each of the plasma sources so that at least one plasma source among the plurality of plasma sources is in the OFF-state and the remaining plasma sources are in the ON-state and the process of processing the substrate by generating plasma from the processing gas by power output from the plurality of plasma sources, and the plasma processing method repeatedly controls so that the plasma source in the OFF-state among the plurality of plasma sources sequentially transitions has been described.

However, the plasma processing method according to the embodiment is not limited thereto. The OFF-state of the plasma source is an example indicating a first state of the plasma source. The ON-state of the plasma source is an example indicating a second state of the plasma source. A plasma source in a power state of a first level may be controlled instead of the plasma source in the OFF-state. The power state of the first level is an example indicating the first state of the plasma source. In addition, it may be controlled to the power state of the second level higher than the power state of the first level, instead of the plasma source in the ON-state. The second level of power state is an example indicating the second state of the plasma source.

In the process of controlling each of the plasma sources, each of the plasma sources may be controlled so that at least one plasma source among the plurality of plasma sources is in the first state indicating the OFF-state or the power state of the first level and the remaining plasma sources are in the second state indicating the ON-state or the power state of the second level higher than the power state of the first level, and it may be repeatedly controlled so that the plasma source of the first state among the plurality of plasma sources sequentially transitions. When at least one plasma source controlled in the first state is a plurality, each plasma source may be controlled to a first state indicating the same power state, or may be controlled to a first state indicating a different power state for each plasma source. Similarly, when remaining plasma sources controlled in the second state are a plurality, each plasma source may be controlled to a second state indicating the same power state, or may be controlled to a second state indicating a different power state for each plasma source.

That is, the controller 80 may control the plasma sources of the microwave transmitting plates 1a to 1g to a low state (a power state greater than the OFF-state and smaller than a high state) instead of controlling to the OFF-state. In addition, the controller 80 may control the plasma sources of the microwave transmitting plates 1a to 1g to a high state (a power state greater than the Low state) instead of controlling to the ON-state. For example, it is not limited to controlling the plasma sources in the outer circumferential region to be in the OFF-state one by one, and it may be controlled so as to power down the plasma sources in the outer circumferential region one by one. It is not limited to controlling the plasma sources in the outer circumferential region to be in the ON-state one by one, and it may be controlled so as to power up the plasma sources in the outer circumferential region one by one. By turning on/off the plasma source in the outer circumferential region and powering down and/or powering up, it is possible to adjust the presence or absence and strength of standing waves appearing on the bottom surface 11a of the ceiling wall 11, and to eliminate the three-fold symmetric distribution of film thickness and the like.

As described above, according to the plasma processing method according to the embodiment, it is possible to disrupt the standing wave appearing on the bottom surface 11a of the ceiling wall 11, and to achieve uniformity of film properties such as uniformity of film thickness and uniformity of film quality (improvement of uniformity of a substrate surface by plasma processing).

It should be considered that the plasma processing method and plasma processing apparatus according to the embodiment disclosed herein are illustrative in all respects and not restrictive. The embodiments may be modified and improved in various forms without departing from the appended claims and the spirit thereof. The matters described in the plurality of embodiments may be combined within the non-contradictory range, and other configurations may be taken within the non-contradictory range.

What is claimed is:

1. A plasma processing method performed in a plasma processing apparatus having a chamber and a plurality of plasma sources, the plurality of plasma sources including a first plasma source disposed at a center of a ceiling of the chamber, and at least three second plasma sources disposed around the first plasma source and at the ceiling of the chamber, the plasma processing method comprising:
   controlling the plurality of plasma sources; and
   generating plasma from a processing gas with power output from the plurality of plasma sources, and processing a substrate,
   wherein said controlling the plurality of plasma sources includes:
   setting one second plasma source among the at least three second plasma sources to a first state referring to an OFF-state or a power state of a first level while other second plasma sources and the first plasma source are set to a second state referring to an ON-state or a power state of a second level higher than the power state of the first level; and
   sequentially transitioning the first state from the one second plasma source to another second plasma source among the other second plasma sources, and
   wherein sequential transitioning of the first state among the second plasma sources is repeatedly performed during the processing the substrate, and the first plasma source is set to the second state and does not transition between the first state and the second state during the processing of the substrate.

2. The plasma processing method of claim 1, wherein the second plasma source of the first state at a first time is adjacent to the other second plasma source of the second state at the first time in a clockwise or a counterclockwise direction.

3. The plasma processing method of claim 1, wherein the sequential transitioning of the first state among the second plasma sources is repeatedly performed in a manner such that the second plasma source of the first state is sequentially transitioned to an n-fold symmetric position.

4. The plasma processing method of claim 3, wherein the second plasma source of the first state at a first time is adjacent to the other second plasma source of the second state at the first time in a clockwise or a counterclockwise direction.

5. The plasma processing method of claim 1, wherein the second plasma source of the first state is sequentially transitioned to the second state at predetermined time intervals, and the sequential transitioning of the first state among the second plasma sources is repeatedly performed in a manner such that the second plasma source of the first state does not continuously maintain the first state after the predetermined time has elapsed.

6. The plasma processing method of claim 5, wherein the predetermined time is variably controlled based on process conditions in said processing of the substrate.

7. The plasma processing method of claim 1, wherein said controlling the plurality of plasma sources includes controlling power output from the second plasma source of the first state and the other second plasma source of the second state respectively so that a sum of power output from all the plasma sources of the plasma processing apparatus is consistent.

8. The plasma processing method of claim 1, wherein the plurality of plasma sources are microwave plasma sources.

* * * * *